United States Patent
Li (10) Patent No.: US 6,339,837 B1
(45) Date of Patent: Jan. 15, 2002

(54) HYBRID METHOD FOR DESIGN VERIFICATION

(76) Inventor: Zhe Li, 1 Argent Dr., Poughkeepsie, NY (US) 12603

( * ) Notice: Subject to any disclaimer, the term of this patent is extended or adjusted under 35 U.S.C. 154(b) by 0 days.

(21) Appl. No.: 09/257,148

(22) Filed: Feb. 24, 1999

Related U.S. Application Data (60) Provisional application No. 60/075,949, filed on Feb. 25, 1998, and provisional application No. 60/076,369, filed on Feb. 27, 1998.

(51) Int. Cl.$^7$ .............................................. G06F 17/50
(52) U.S. Cl. .......................................................... 716/5
(58) Field of Search ................... 716/4, 5, 6

(56) References Cited

U.S. PATENT DOCUMENTS

| | | |
|---|---|---|
| 5,331,568 A | 7/1994 | Pixley |
| 5,465,216 A | 11/1995 | Rotem et al. |
| 5,481,717 A | 1/1996 | Gaboury |
| 5,491,639 A | 2/1996 | Filkorn |
| 5,493,508 A | 2/1996 | Dangelo et al. |
| 5,513,122 A | 4/1996 | Cheng et al. |
| 5,528,165 A | 6/1996 | Simovich et al. |
| 5,594,656 A | 1/1997 | Tamisler |
| 5,615,137 A | 3/1997 | Holzmann et al. |
| 5,752,000 A | 5/1998 | McGeer et al. |
| 5,754,454 A | 5/1998 | Pixley et al. |
| 6,083,269 A * | 7/2000 | Graef ........................... 703/14 |
| 6,141,630 A * | 10/2000 | McNamara ................... 703/14 |

OTHER PUBLICATIONS

Pixley, Carl, "Commercial Design Verification: Methodology and Tools",1996 pp. 839–848.*

Kumar, "Designing a custom DSP Circuit Using VHDL", Oct. 1990, pp. 46–52.*

Carl Pixley et al "Commercial Design Verification: Methodology and Tools" Proceedings of IEEE International Test Conference, 1996, pp. 839–848, IEEE, USA.

Abhijit Ghosh et al "Test Generation and Verification for Highly Sequential Circuits" IEEE Transaction on Computer–Aided Design, Vol. 10, No. 5, May 1991, pp. 652–667, IEEE, Piscataway, NJ, USA.

Srinivas Devadas "Approaches to Multi–Level Sequential Logic Synthesis" 26th ACM/IEEE Design Automation Conference, 1989, pp. 270–276, Association for Computing Machinery, New York, NY, USA.

J. Lawrence Carter et al "Restricted Symbolic Evaluation is Fast and Useful" Proceedings of International Conference on Computer–Aided Design, 1989, IEEE, USA.

Nagendra C.E. Srinivas et al "Formal Verification of Digital Circuit Using Hybrid Simulation" IEEE Circuits and Devices Magazine, Jan. 1988, pp. 19–27 The Institute of Electrical and Electronics Engineers, Inc. Piscataway, NJ, USA.

* cited by examiner

*Primary Examiner*—John F. Niebling
*Assistant Examiner*—Stacy Whitmore (57) ABSTRACT

A method for verifying a digital circuit design in a hardware description language, using a verification structure and a verification engine, is disclosed. The verification structure is constructed by including the design under test and additional statements in the hardware description language so that the functional verification problem becomes whether the verification structure is equivalent to a predetermined constant. These additional statements are provided to describe input constraints and behavioral expectations, and they effectively describe a test bench with a group of test cases. The verification engine automatically gives a conclusion after analyzing the verification structure as a digital circuit design. The functional correctness of the design can be completely verified using a number of verification structures.

20 Claims, 6 Drawing Sheets

```
module TESTBENCH (clk, inputs, one);
    input clk;
    input [5 : 0] inputs;
    output one;
    reg one;
    wire full;
    wire [3 : 0] rCntGray, wCount;
    reg [3 : 0] wCnt, rCount;
    reg reset;
    model1 testgen_model1(full, rCntGray, wCnt, clk, reset);    ←—501
    assign {wCount, rCntGray} = inputs;
    initial begin
            one = 1;
            reset = 1;
            @(posedge clk) wCnt = wCount;
            case(rCntGray)
                        4'b0000 : rCount = 4'd9;
                        4'b0001 : rCount = 4'd0;
                        4'b0011 : rCount = 4'd1;
                        4'b0010 : rCount = 4'd2;
                        4'b0110 : rCount = 4'd3;
                        4'b0111 : rCount = 4'd4;
                        4'b1111 : rCount = 4'd5;
                        4'b1110 : rCount = 4'd6;
                        4'b1100 : rCount = 4'd7;
                        4'b1000 : rCount = 4'd8;
                        default : rCount = 4'd8;
            endcase
            @(posedge clk) wCnt = rCount;
            @(posedge clk) wCnt = wCount;
            @(posedge clk) begin
                        wCnt = wCount;
                        one = full;    ←—503
            end
        end
endmodule
```

502 brackets the block from `assign` through `end`.

FIG. 5

```
module model1 (full, rCntGray, wCnt, clk, reset);
output      full;                                              600
input  [3:0] wCnt, rCntGray;
input       clk, reset;
reg         full, fullNext;
reg    [3:0] distance, rCntGray_s1, rCntGray_s2, rCnt;

always @(rCntGray_s2) begin : convertGrayBinary
  case(rCntGray_s2)
    4'b0000 : rCnt = 4'd0; 4'b0001 : rCnt = 4'd1; 4'b0011 : rCnt = 4'd2;
    4'b0010 : rCnt = 4'd3; 4'b0110 : rCnt = 4'd4; 4'b0111 : rCnt = 4'd5;
    4'b1111 : rCnt = 4'd6; 4'b1110 : rCnt = 4'd7; 4'b1100 : rCnt = 4'd8;
    4'b1000 : rCnt = 4'd9; default : rCnt = 4'd9;
  endcase
end always @(wCnt or rCnt) begin : computeFullness
  if (wCnt == rCnt)
    distance = 4'b0000;
  else
  begin
    if (wCnt < rCnt) distance = 4'd10 - rCnt + wCnt; else distance = wCnt - rCnt;
  end
  if (distance == 4'd9) fullNext = 1'b1; else fullNext = 1'b0;
end always @(posedge clk or negedge reset) begin : updateS2Status
  if (!reset)
    begin
      full <= 1'b0; rCntGray_s1 <= 4'b0000; rCntGray_s2 <= 4'bxxxx;
    end
  else
    begin
      full <= fullNext; rCntGray_s1 <= rCntGray; rCntGray_s2 <= rCntGray_s1;
    end
end endmodule
```

HYBRID METHOD FOR DESIGN VERIFICATION

This application claims benefit of provisional application Nos. 60/075,949, filed Feb. 25, 1998 and No. 60/076,369, filed Feb. 27, 1998.

CROSS-REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

This invention relates to verification methods for electronic circuit designs' functional correctness using a computer program.

A digital circuit includes gates, registers and wires connecting the gates and registers. When people make a large digital circuit design, they write the design in a hardware description language. IEEE standards 1076 and 1364 are 2 well-known hardware description languages. For the purpose of avoiding erroneous chips, they have to verify that the design is functionally correct before transforming the design into a format used for fabricating the chip. As chips growing larger and larger, the existing verification methods are no longer able to guarantee their function correctness.

A method to verify functional correctness is to use a simulator. The simulator reads the circuit design and a set of stimulus values for the inputs of the circuit design. The simulator then computes the circuit design's response behavior. The circuit design's functional correctness is decided by comparing the computed response behavior with the expected behavior. These stimulus values are usually supplied in test benches. After the simulator is started, it can read only one test bench, and each test bench supplies only one stimulus value for any input of the circuit design unless the simulator advances the time. The simulator has to be started again before using a different test bench. Each run can only handle only one case while the circuit is designed to handle numerous different cases. This method can handle nearly all practical cases but it is not efficient because too many simulation runs are required for a large design and a lot of computation in the simulator is repeated too many times.

Another method to verify functional correctness is to use a model checker. The model checker reads the circuit design and a statement written in a temporal logic language. The model checker determines whether the statement exactly describes a property of the circuit design. It does this by first computing the state space and then verifying the property against the state space. The circuit design is functionally correct if the model checker gives a positive answer. This method is efficient but it does not work for large circuit designs because its memory requirement for the executing computer is often exponentially proportional to the circuit design's size, and this problem often happens in the step of computing the state space.

Some symbolic simulation methods also exist. They propagate expressions through gates and registers. These expressions can easily become too large for any computer to handle. These big expressions may not all be needed because often some outputs are not compared against the expectation.

Some hardware methods also exist for functional verification. They are much more expensive than the above software methods, and their efficiency is limited due to the limitation of hardware complexities.

Minimization methods for sequential machines were invented to reduce the size of a digital circuit design during synthesis process without changing the circuit's behavior, but they were not applied to functional verification before because (1) synthesis and functional verification have different minimization goals and (2) they traditionally use different subsets of hardware description languages.

Automatic test pattern generation (ATPG) methods for non-scan sequential machines were invented known to generate test sequences for detecting stuck-at-1 and stuck-at-0 faults that can happen after the digital circuits are fabricated, but they were not applied to functional verification before.

Changing digital circuits to combinatorial circuits using unrolling techniques was known and it was applied to a different context of traditional simulation in U.S. Pat. No. 5,752,000 to McGeer et al (1998). The unrolling techniques are well known to those skilled in the art for limited applications in ATPG, but they are generally not used for synthesis because the equivalence between the digital circuits and the combinational circuits is true only if the number of clock cycles being considered is below a given limit.

Equivalence checking between combinatorial circuits was known, and it was applied to a different and restricted form of digital circuit verification in U.S. Pat. No. 5,754,454 to Pixley et al (1998), where the complete equivalence between two digital circuits were to be proven. ATPG techniques for combinational circuits are known to be useful within this kind of equivalence checking.

BRIEF SUMMARY OF THE INVENTION

The present invention provides a method for verifying a digital circuit design in a hardware description language, using a verification structure and a verification engine. The verification structure is constructed by including a design under test and additional statements in the hardware description language so that the functional verification problem becomes whether the verification structure is equivalent to a predetermined constant. These additional statements are provided to describe input constraints and behavioral expectations, and they effectively describe a test bench with a group of test cases. The verification engine automatically gives a conclusion after analyzing the verification structure as a digital circuit design. The functional correctness of the design can be completely verified using a number of verification structures.

The objects and advantages of this invention are to provide functional verification methods that
(a) are efficient due to high coverage in each run,
(b) work well for large circuit designs because of avoiding a big bottleneck step, and
(c) do not require any language in addition to a hardware description language.

Further objects and advantages of this invention will become apparent from a consideration of the drawings and ensuing description.

DETAILED DESCRIPTION OF THE INVENTION

A method for verifying a digital circuit design in a hardware description language, using verification structure 111 and a verification engine, is disclosed.

Figure 1:
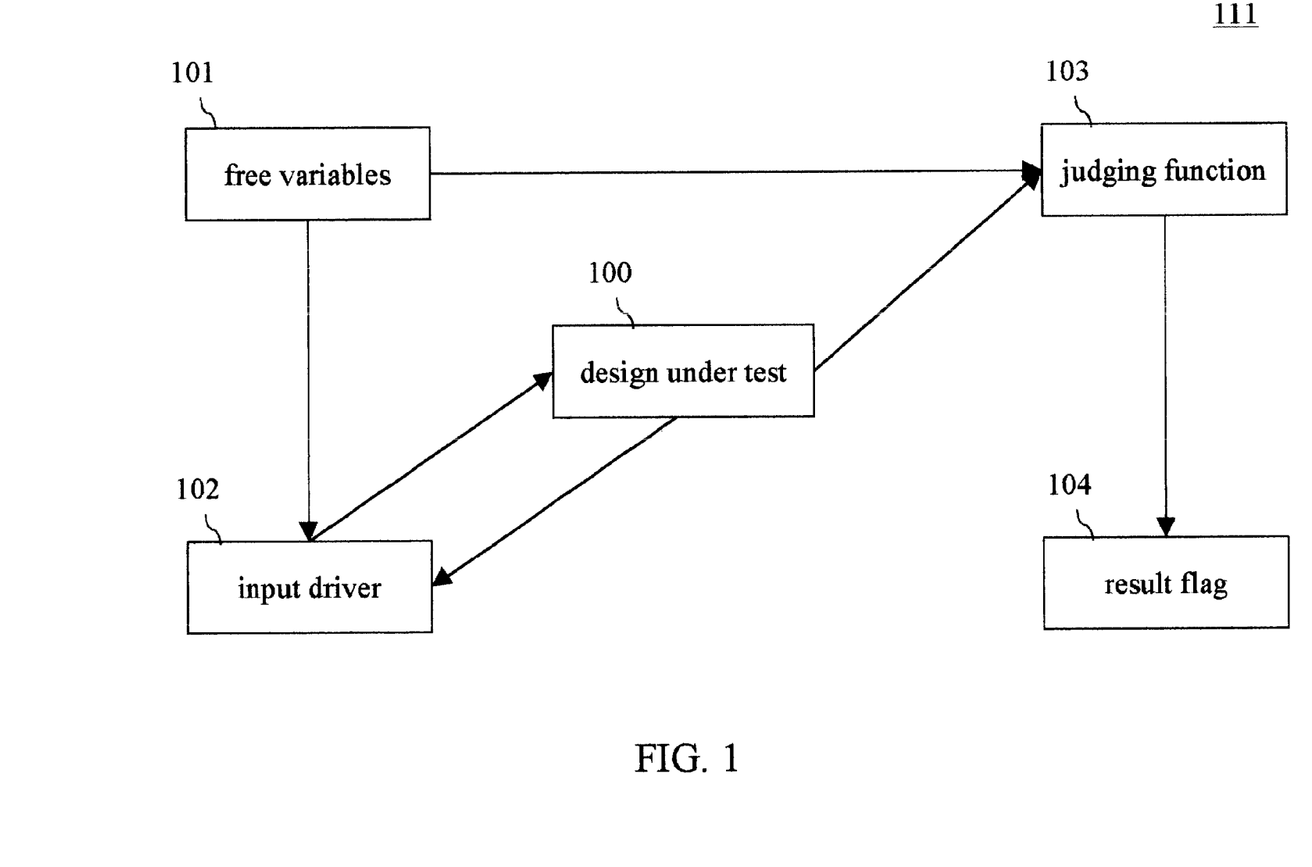
FIG. 1 illustrates, in block diagram form, a verification structure 111.

FIG. 1 illustrates a verification structure 111 of a preferred embodiment of the present invention comprises (a) design under test 100, (b) a number of free variables 101, (c) an input driver 102, (d) a judging function 103, and (e) a result flag 104.

All these parts can be represented in a hardware description language, and they are physically in one or more electronic files in a storage area.

Design under test 100 is an instance of the design to be verified. A design can be used in an environment multiple times for different purposes, and each of these uses is an instance.

A clock (not shown in figures) is a specially identified wire in verification structure 111. The clock is shared by all parts of verification structure 111.

A number of wires without sources are used to represent free variables 101 in the preferred embodiment. Values on a wire for different clock cycles represent different free variables 101, and values on different wires for a clock cycle also represent different free variables 101. Each of free variables 101 represents a degree of freedom because this free variable's value can be either 1 or 0. Therefore, n free variables 101 represent 2 to the power of n different value combinations. The initial value of any uninitialized register also represents one of free variables 101. In a preferred embodiment, whether a register is initialized is controlled by a mechanism that selects one from several alternatives of implementation details of a component design. This selecting mechanism is through configurations in IEEE Standard 1076 and parameters in IEEE Standard 1364.

Input driver 102 can be a structural or behavioral description of a sequential or combinatorial circuit. The outputs of input driver 102 are connected to the inputs of design under test 100. The inputs of input driver 102 can include any wires representing free variables 101, the clock, and any wires of design under test 100. Input driver 102 and free variables 101 represent the constraints on the input values of design under test 100, including interrelations on the input values of design under test 100 and interactions between input driver 102 and design under test 100. These constraints define a space (or a collection) of input stimuli so that all test cases within this space can be processed collectively. Such collective processing then makes it possible to avoid repeating certain common operations. Free variables 101 correspond to the degrees of freedom within this space. Usually input driver 102 comprises a number of constants and some behavioral description, and it may also include an ending indicator.

Judging function 103 has one and only one output, and this output is connected to result flag 104. The inputs of judging function 103 can include any wires representing free variables 101, the clock, and any wires of design under test 100. Judging function 103 can include any circuit description (sequential or combinatorial) and it collects the concerned behavior of design under test 100. This behavior collection can include any interrelations between any wire values of design under test 100, either across different wires or across different clock cycles. Usually the inputs of judging function 103 include at least one wire of design under test 100, and the simplest embodiment of judging function 103 is a wire connecting a wire of design under test 100 to result flag 104. Judging function 103 usually also include an ending indicator as a part of the behavioral description. The value of the output of judging function 103 is not able to change after reaching the ending indicator regardless the activities in the rest of verification structure 111. In a preferred embodiment, judging function 103 must include at least one ending indicator. It is possible for judging function 103 and input driver 102 to share some parts, including the ending indicator.

Result flag 104 is a specially identified wire. It can be identified in a number of ways, and one of the ways is to make it the only output of verification structure 111. Result flag 104 is the only observable point in verification structure 111 to the outside. Judging function 103 collects the correctness information in verification structure 111, and result flag 104 defines the predetermined polarity of the correctness. One predetermined value of result flag 104 represents that design under test 100 satisfies the behavioral expectation. This value can be identified in a number of ways, and this value is always 1 in a preferred embodiment. If result flag 104 is evaluated to have this value for all clock cycles, design under test 100 is declared correct with respect to the constraints on the input values of design under test 100.

An ending indicator (not shown in figures) signifies the end of all value changes in the circuit part. This is supported by behavioral description capabilities of all hardware description languages. It is a "wait" statement without arguments in IEEE standard 1076 (also known as VHDL), and it is the end of an "initial" statement in IEEE standard 1364 (also known as Verilog).

By providing both the input constraints in input driver 102 and free variables 101 and the behavioral expectation in judging function 103 and result flag 104, one can easily divide the total verification task into multiple runs of the tool in order to control the complexity of each run.

Verification structure 111 simply includes design under test 100 and some additional logic, and then it transforms the verification task of each run into checking whether a Boolean function of free variables 101 is equivalent to a predetermined Boolean constant. Initially this Boolean function is completely in a hardware description language, and there are needs to convert it to an easier-to-handle representation as long as the conversion process is not too costly.

Figure 6:
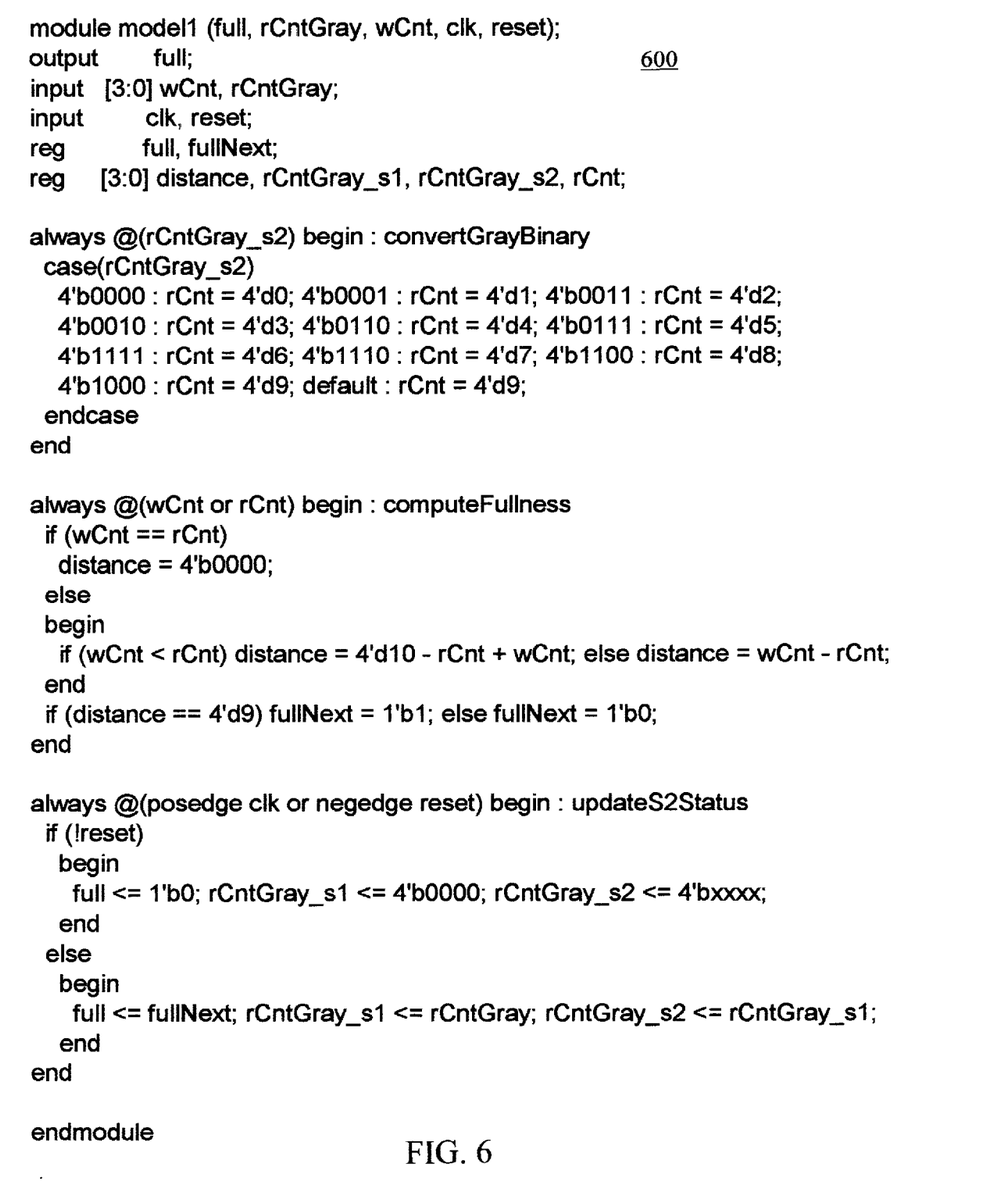
FIG. 6 is a design to be verified in FIG. 5.

FIG. 6 is an example design 600 of a digital circuit written in IEEE Standard 1364. It is a sequential state machine with 9 state variables.

Figure 5:
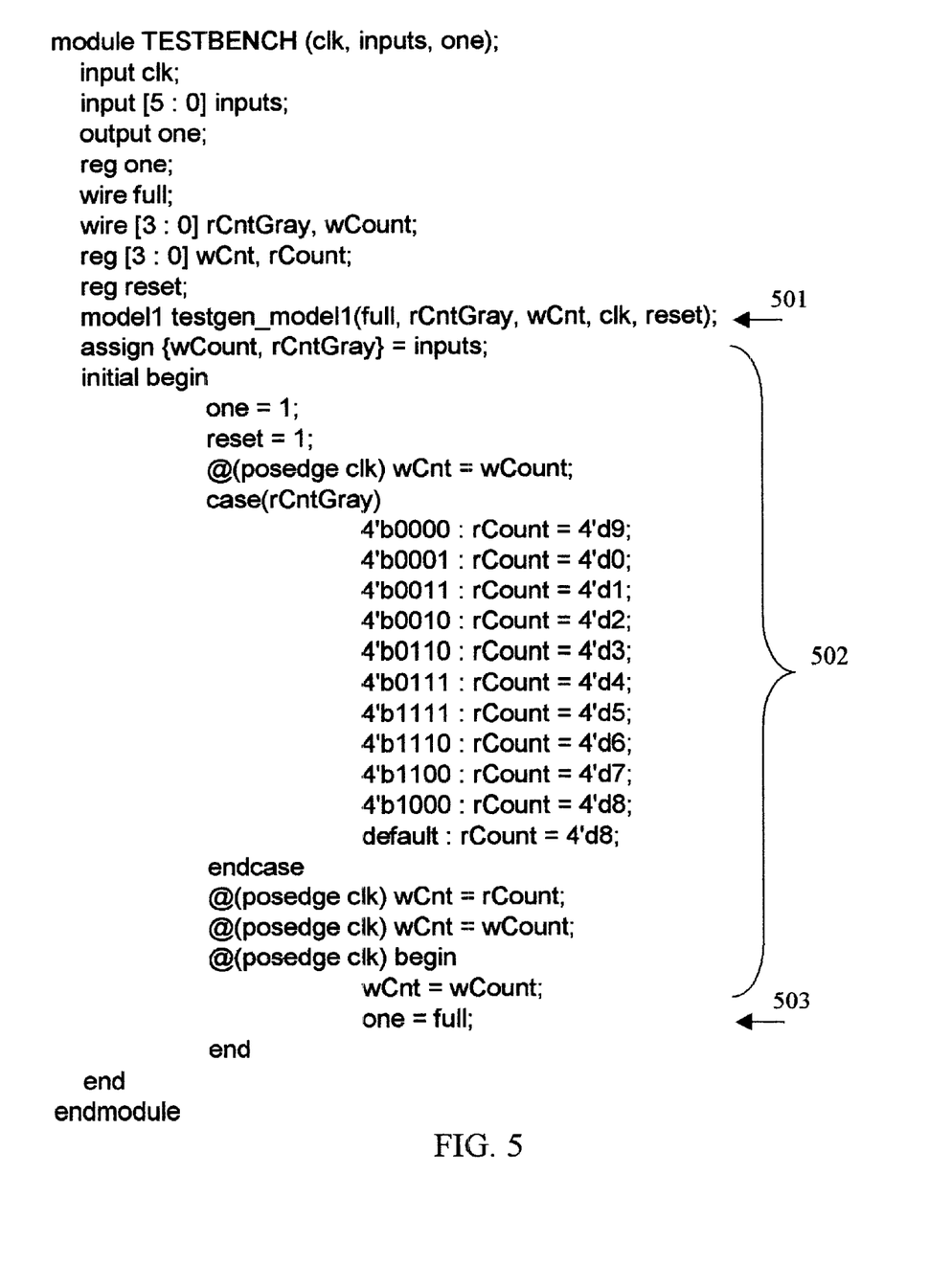
FIG. 5 is an example of verification structure 111.

FIG. 5 is an example of verification structure 111 for verifying example design 600. A statement 501 identifies example design 600 as design under test 100. The clock has an identifier "clk". Free variables 101 are introduced by identifier "inputs". Statements 502 are for input driver 102, and they provide sources to "rCntGray", "wCnt" and "reset", which are all inputs of design under test 100. Judging function 103 is simply in statement 503 because "full" is a wire from design under test 100 according to statement 501. Result flag 104 has an identifier "one" so that the verification engine will give a positive conclusion if the value of result flag 104 is always 1 in this preferred embodiment. Ending indicator is reached when the flow goes to the last "end" statement because it matches the "begin" after the reserved word "initial". Each line with a "@" sign implies the behavior moving from one clock cycle to the next.

Figure 2:
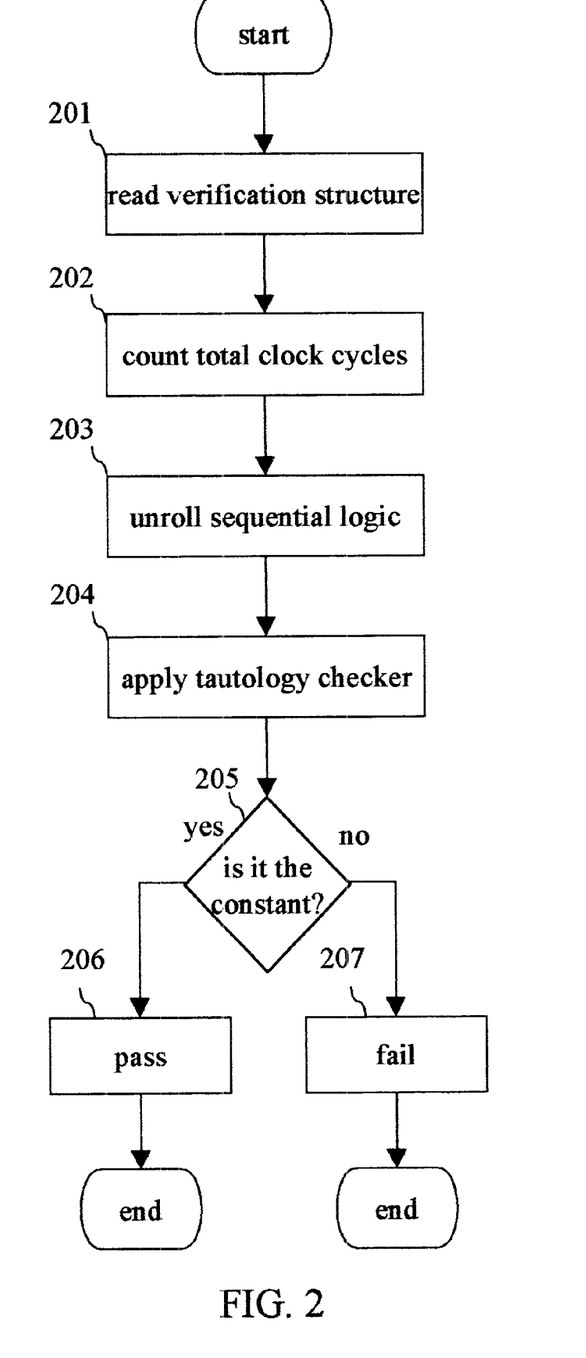
FIG. 2 illustrates, in flow diagram form, a first algorithm for processing verification structure 111.

FIG. 2 illustrates a verification engine in the first embodiment, comprising four steps: an interpreter 201, a cycle counter 202, an unroller 203, and an equivalence checker 204. Interpreter 201 translates verification structure 111 from a hardware description language into a data structure representing a network of gates and registers. Cycle counter 202 determines the clock cycle number involved in the behavior being simulated up to the ending indicator. Unroller 203 traverses the network of gates and registers in the result of interpreter 201 from result flag 104, with the clock cycle number from cycle counter 202, to free variables 101 and builds a data structure representing a network of gates. Unroller 203 copies the contributing gates for each clock cycle and connects the consecutive copies by replacing each register with a wire between its data input and its data output. For the initial cycle, each register's data output takes the register's initial value if there is any, or otherwise one of free variables 101. For the final cycle, the register inputs are ignored if they are not connected to result flag 104. Equivalence checker 204 determines whether the network of gates makes every copy of result flag 104 generated by unroller 203 equivalent to the predetermined value of result flag 104. The answer from equivalence checker 204 is taken to a decision point 205, which declares the verification a success 206 if it is all positive. Otherwise it declares the verification a failure 207. All steps before taking the answer from equivalence checker 204 can include Boolean simplification techniques for the sake of reducing the amount of computation.

Figure 3:
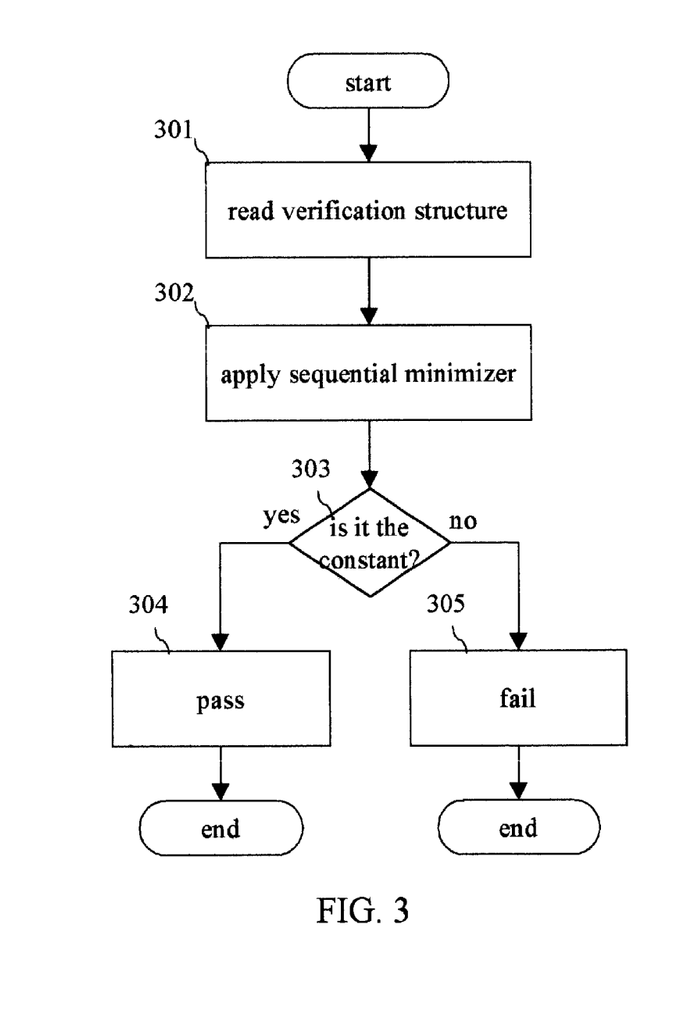
FIG. 3 illustrates, in flow diagram form, a second algorithm for processing verification structure 111.

FIG. 3 illustrates the second embodiment of my verification engine. A step 301 interprets verification structure 111, then a sequential machine minimizer 302 is applied. The answer from sequential machine minimizer 302 is taken to a decision point 303, which declares the verification a success 304 if sequential machine minimizer 302 generates a constant of the predetermined value of result flag 104 from verification structure 111. Otherwise it declares the verification a failure 305.

Figure 4:
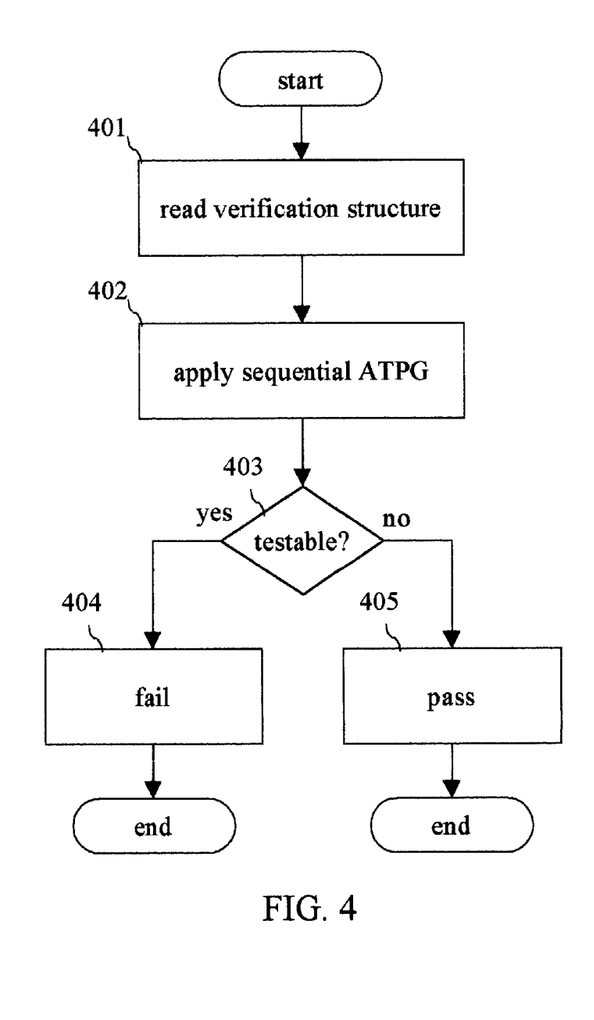
FIG. 4 illustrates, in flow diagram form, a third algorithm for processing verification structure 111.

FIG. 4 illustrates the third embodiment of my verification engine. A step 401 interprets verification structure 111, then a non-scan sequential ATPG (automatic test pattern generator) 402 is applied for detecting the fault of result flag 104 stuck at its predetermined value. The answer from non-scan sequential ATPG 402 is taken to a decision point 403, which declares the verification a success 405 if non-scan sequential ATPG 402 produces no pattern for the fault. Otherwise it declares the verification a failure 404.

Users use this invention to verify the functional correctness of designs written in a hardware description language. For this purpose, users need to first select a collection of stimuli and clarify what signal behavior is expected for each element in the collection of stimuli. The stimulus collection includes combinations of input values for a finite number of clock cycles and the initial values of all registers. The signal behavior for each element of the stimulus collection generally is a Boolean function of values of certain signals for certain clock cycles, and this Boolean function can also include a specification of the uncertainty of the expected behavior.

After defining the total stimulus collection and the corresponding expected behavior, users need to divide them into a number of verification structures 111.

Each of these verification structures 111 covers a subset of the stimulus collection, and this coverage is completely defined by free variables 101 and input driver 102 in verification structure 111. This combination of free variables 101 and input driver 102 can represent any constraints among input values of design under test 100 across any number of clock cycles, and these constraints can be different for different clock cycles.

The expected behavior corresponding to the stimuli covered by verification structure 111 may be covered completely by judging function 103 of verification structure 111 or may be covered jointly by judging functions 103 of several verification structures 111.

After clearly defining the part of stimulus collection and the expected behavior covered by each verification structure 111, users generate all these verification structures 111 in any way they prefer, and then save them in some storage areas.

A verification engine is applied to each verification structure 111 individually. The verification engine reads verification structure 111 from the storage area, and before it finishes it tells whether the output of judging function 103 of verification structure 111 is equivalent to a constant that has the predetermined value of result flag 104 of verification structure 111. If the answer is negative, the verification engine optionally provides one or more elements in the covered subset of the stimulus collection. Each of these provided elements should cause that the output of judging function 103 of verification structure 111 is not equivalent to a constant that has the predetermined value of result flag 104 of verification structure 111. Therefore each of these provided elements can be used to identify the cause of the inequivalency. The cause can be in design under test 100, in input driver 102, or in judging function 103. In either case, the cause needs to be identified and fixed. After fixing the cause, the verification engine should be applied again to new verification structure 111 to assure of the absence of other causes of the inequivalency.

When the verification engine shows that the output of judging function 103 of every verification structure 111 is equivalent to a constant that has the predetermined value of result flag 104 of verification structure 111, the functional correctness of design under test 100 is verified completely.

This invention provides a way to define the meaning of correctness by describing a behavioral expectation. It also provides a way to define the verification scope by describing constraints on the input values of design under test 100. Based on these, this invention provides functional verification methods that (a) are efficient due to high coverage in each run, (b) work well for large circuit designs because of avoiding a big bottleneck step, and (c) do not require any language in addition to a hardware description language.

Complete verification can be then achieved by applying the verification methods of this invention multiple times using different scopes and different meanings of correctness.

Figure 7:
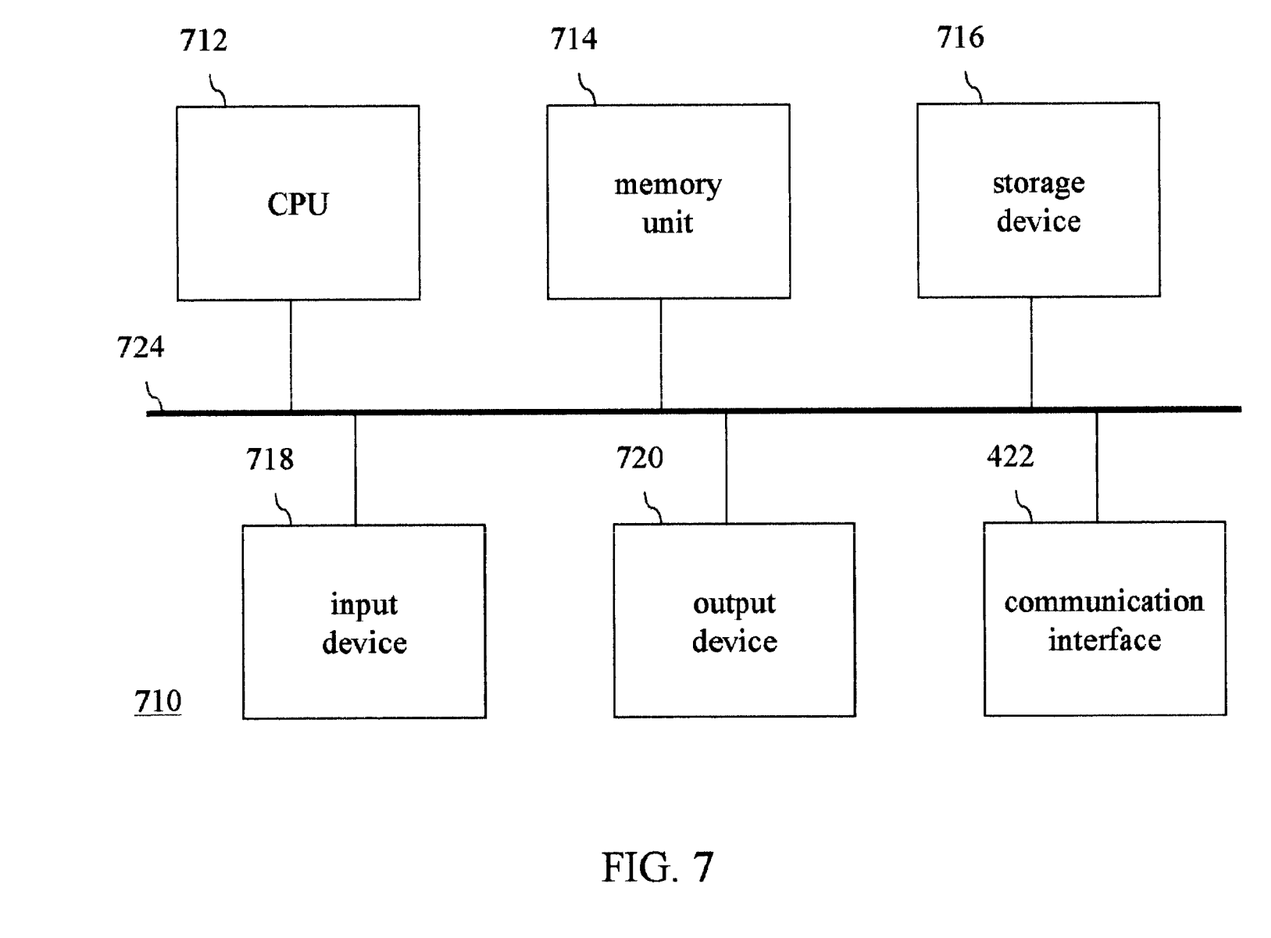
FIG. 7 is a representative computer system 710 in conjunction with which the embodiments of the present invention may be implemented.

FIG. 7 discloses a representative computer system 710 in conjunction with which the embodiments of the present invention may be implemented. Computer system 710 may be a personal computer, workstation, or a larger system such as a minicomputer. However, one skilled in the art of computer systems will understand that the present invention is not limited to a particular class or model of computer.

As shown in FIG. 7, representative computer system 710 includes a central processing unit (CPU) 712, a memory unit 714, one or more storage devices 716, an input device 718, an output device 720, and communication interface 722. A system bus 724 is provided for communications between these elements. Computer system 710 may additionally function through use of an operating system such as Windows, DOS, or UNIX. However, one skilled in the art of computer systems will understand that the present invention is not limited to a particular configuration or operating system.

Storage devices 716 may illustratively include one or more floppy or hard disk drives, CD-ROMs, DVDs, or tapes input device 718 comprises a keyboard, mouse, microphone, or other similar device. Output device 720 is a computer monitor or any other known computer output device. Communication interface 722 may be a modem, a network interface, or other connection to external electronic devices, such as a serial or parallel port.

While the above invention has been described with reference to certain preferred embodiments, the scope of the present invention is not limited to these embodiments. One skilled in the art may find variations of these preferred embodiments which, nevertheless, fall within the spirit of the present invention, whose scope is defined by the claims set forth below.

I claim:

1. A method for verification of a design, the design including a set of one or more inputs, a set of one or more storage elements and a set of one or more wires, comprising the steps of:

defining a set of one or more free variables;

defining at least one constraint connecting said set of one or more free variables to a subset of the said set of one or more inputs;

defining at least one behavioral expectation connecting a subset of said set of one or more wires to a result flag; and constructing a verification structure, said verification structure comprising said set of one or more free variables, said at least one constraint and said at least one behavioral expectation, whereby said at least one constraint represents a space of input stimuli, where the input stimuli include initial values for a subset of said set of one or more storage elements and depend on said set of one or more free variables, and said at least one behavioral expectation for a subset represents the correct operation of the design in response to said space of input stimuli.

2. A method for verification of a design, the design including a set of one or more inputs, a set of one or more storage elements and a set of one or more outputs, as in claim 1 further comprising the step of:

evaluating said verification structure, whereby it is determined whether the design meets said at least one behavioral expectation under said at least one constraint.

3. A method for verification of a design, the design including a set of one or more inputs, a set of one or more storage elements and a set of one or more wires, as in claim 2 wherein the step of evaluating comprises the step of:

performing sequential logic minimization on said verification structure to produce a simplified verification structure; and determining whether said simplified verification structure is equivalent to a predetermined constant.

4. A method for verification of a design, the design including a set of one or more inputs, a set of one or more storage elements and a set of one or more wires, as in claim 2 wherein the step of evaluating comprises the step of:

performing automatic test pattern generation for non-scan sequential circuits on said verification structure to produce a set of zero or more test patterns for at least one stuck-at-fault at the output of said at least one behavioral expectation; and determining whether said set of zero or more test patterns is null.

5. A method for verification of a design, the design including a set of one or more inputs, a set of one or more storage elements and a set of one or more wires, as in claim 2 wherein said at least one constraint is used only within a predetermined number of clock cycles, said at least one behavioral expectation is used only within a predetermined number of clock cycles, and the step of evaluating comprises the step of:

unrolling said verification structure to produce an iterative combinatorial network model.

6. A method for verification of a design, the design including a set of one or more inputs, a set of one or more storage elements and a set of one or more wires, as in claim 5 wherein the step of evaluating further comprises the step of:

performing equivalence checking on said iterative combinatorial network model to determine whether said iterative combinatorial network model is equivalent to a predetermined constant.

7. A method for functional verification of a data-processing system, comprising the steps of:

(a) in a storage device storing structure means for describing a testing system, comprising (1) means for representing a result flag, (2) means for describing said data-processing system, (3) expectation means for connecting said data-processing system to said result flag, (4) means for providing a set of one or more free variables, and (5) means for describing constraints on the inputs of said data-processing system and on the initial state of said data-processing system based on said set of one or more free variables; and (b) determining functional equivalence between a predetermined constant value and the parts in said structure means connected to said result flag, whereby said expectation means describes expected behavior of said data-processing system under said constraints, and a match is found between the expected behavior and the actual behavior if said functional equivalence is proven in the determined step.

8. The method as claimed in claim 7, wherein said constraining means comprises driver means for connecting said set of one or more free variables and the behavior of said data-processing system to the inputs of said data-processing system, whereby relevant combinations of input values of said data-processing system are clearly defined and it is allowed for said data-processing system and said driver means to interact.

9. The method as claimed in claim 8, wherein said structure means further comprises a clock, whereby behavior can be easily described in term of cycles of said clock.

10. The method as claimed in claim 9, wherein said a member of said set of one or more free variables is provided as the value of a wire for a cycle of said clock if said wire is not otherwise given any value for said cycle of said clock, whereby a free variable's value can be either 1 or 0 in a digital circuit and a register's initial state is a value of a wire for the initial cycle.

11. The method as claimed in claim 10, wherein said expectation means comprises an ending indicator, whereby only a limited clock cycles of the behavior of said data-processing system is involved.

12. The method as claimed in claim 11, wherein said step of determining functional equivalence comprises the steps of:
(a) translating said structure means into a first representation a network of gates and registers,
(b) counting the number of clock cycles involved in said expectation means,
(c) converting said first representation of said network of gates and registers to a second representation of a network of gates by making a copy of the gates for each involved clock cycle and connecting these copies by linking each register's data input to its data output of the copy for the next clock cycle, and
(d) checking Boolean equivalence between said predetermined constant value and the network of gates feeding each copy of said result flag in said second representation of a network of gates, whereby said functional equivalence is determined positive only if said checking step for every said copy of said result flag.

13. The method as claimed in claim 12, wherein said step of translating comprises Boolean simplification.

14. The method as claimed in claim 12, wherein said step of counting comprises Boolean simplification.

15. The method as claimed in claim 12, wherein said step of converting comprises Boolean simplification.

16. The method as claimed in claim 12, wherein said step of checking Boolean equivalence comprises Boolean simplification.

17. The method as claimed in claim 7, wherein said data-processing system is a digital circuit.

18. The method as claimed in claim 7, wherein said data-processing system is a communication protocol.

19. The method as claimed in claim 7, wherein said data-processing system is a computer program.

20. The method as claimed in claim 7, wherein said data-processing system is a microprogram.

* * * * *